United States Patent [19]

Calver et al.

[11] Patent Number: 4,691,265
[45] Date of Patent: Sep. 1, 1987

[54] SEMICONDUCTOR MOUNTING ASSEMBLY

[75] Inventors: John G. Calver, Rochester; Phillip W. Pearce, Pavilion; Erich Zielinski, Bergen, all of N.Y.

[73] Assignee: Eastman Kodak Company, Rochester, N.Y.

[21] Appl. No.: 905,903

[22] Filed: Sep. 10, 1986

[51] Int. Cl.$^4$ .............................................. H05K 7/20
[52] U.S. Cl. .................................... 361/386; 361/388
[58] Field of Search ........................ 361/386, 388, 389; 339/17 N

[56] References Cited

U.S. PATENT DOCUMENTS

| | | | |
|---|---|---|---|
| 3,895,267 | 7/1975 | Gordon et al. | 339/17 N |
| 4,342,068 | 7/1982 | Kling | 361/386 |
| 4,484,381 | 11/1984 | Ellis et al. | 361/386 |

*Primary Examiner*—Robert S. Macon
*Attorney, Agent, or Firm*—Robert R. Randall

[57] ABSTRACT

An assembly for mounting a heat-generating semiconductor to an associated heat sink whereby direct heat conducting contact is assured between the semiconductor body and the heat sink by an element which electrically isolates and insulates the semiconductor from the other components while at the same time locating and providing pressure to clamp the semiconductor on the heat sink. The present assembly provides good thermal contact and adapts to thermal expansion of the system during operation to assure the maintainance of the contact regardless of temperature changes within the device. The assembly comprises a heat-dissipating base element having plan dimensions which are larger than the plan dimensions of the semiconductor. A retainer member is formed of a dielectric material and has means for locating and retaining the semiconductor. The retainer member also includes a plurality of arms connected to the locating and retaining means. The relative thicknesses of the semiconductor locating and retaining means and the semiconductor, and the positioning of the arms with respect thereto, are such that the ends of the arms are deflected when the retainer member is connected to the base element to force the semiconductor and the base element into intimate heat transmitting contact. Further means is provided for connecting the base element and the arms of the retainer member.

22 Claims, 3 Drawing Figures

SEMICONDUCTOR MOUNTING ASSEMBLY

BACKGROUND OF THE INVENTION

The present invention is generally directed to a structure for mounting a heat-generating semiconductor, such as a triac type semiconductor, onto a heat dissipating device, or heat sink.

Triac semiconductors have, in recent years, been used with increasing frequency in various electric and electronic components. Such semiconductor devices generate large quantities of heat which must be dissipated in order to prevent the deterioration and, ultimately, the destruction of the semiconductor device. It is known to mount such semiconductors onto heat dissipating devices, such as "heat sinks" which, because of the high heat conductivity thereof, are often formed of an electrically conductive metal plate, to keep the semiconductor temperature within acceptable limits. A typical triac switching device is formed with a body portion containing the semiconductor and an apertured metallic mounting tab extending therefrom. Such a triac is also usually provided with a plurality of electrical leads extending from the opposite side of the body portion from the mounting tab.

Because of the high heat generated by triacs, numerous mounting methods have been developed to assure heat dissipation therefrom. A variety of such mounting techniques have been the subject of patents including U.S. Pat. No. 3,641,474 which teaches the utilization of a mounting screw through the mounting tab to connect the semiconductor to a heat sink. One problem encountered in the use of a mounting screw is that, as the screw is tightened, the body portion containing the semiconductor tends to rotate, causing the protruding electrical leads to twist, possibly causing a short circuit. The teaching of this patent is that the twisting problem can be eliminated by providing anti-twisting tabs. However, another problem of this mounting method results from the fact that the mounting tab of the triac is often electrically live and must be electrically isolated from the mounting screw. Moreover, tightening of the mounting screw has been found to bend the tab, lifting the body portion away from the heat sink, thereby reducing the heat dissipation possible.

Another method of mounting such heat-generating semiconductor devices is illustrated in U.S. Pat. No. 4,259,685 wherein a metal spring is associated with the semiconductor device to bias it into good heat conductive relationship with the associated heat sink. However, the use of such springs can result in other problems such as the possibility of the springs breaking or falling out of the housing and short circuiting the triac or other portion of the electronic assembly. This is in addition to the extra assembly care that must be taken to assure the spring is electrically insulated from the conductive parts of the semiconductor.

Still another method of mounting such heat-generating semiconductors to a heat sink is illustrated in U.S. Pat. No. 4,199,654 in which a semiconductor housing is provided having a body cavity arranged to accept the semiconductor device. In the device disclosed in this patent, the body cavity of the housing has a depth which is slightly greater than the thickness of the body portion of the triac so that all of the force is applied to the mounting tab in an attempt to assure the necessary good contact between the semiconductor and the heat sink to assure adequate heat removal. However, it has been found that it is possible for the tab to be bent slightly so that, although the tab itself is in good contact with the heat sink, the semiconductor body itself is held out of contact with the heat sink due to the force applied to the tab. This is contrary to good thermodynamic practice because the heat generated in the semiconductor body must be conducted away by the tab rather than directly from the semiconductor body into the heat sink.

Yet another method of attaching a heat-generating semiconductor to a heat sink is disclosed in U.S. Pat. No. 4,449,292 in which the semiconductor is applied to the heat sink by means of soldering or the use of an adhesive. While in theory this may provide a satisfactory solution to the problem, in practice it has been found that these methods of attaching the semiconductor are less than satisfactory in many cases because the adhesive or solder joint may be degraded by the heat generated, which reduces the conductivity of the joint, thus increasing the temperature, eventually destroying the joint and the semiconductor.

While the problem of heat removal from heat-generating semiconductors is significant because it can result in the destruction of the semiconductor, it has been found that a far more serious problem results when such a semiconductor fails due to the smoke and soot generated by the failure, which can seriously damage or destroy the entire power supply in which it is incorporated. As a result, not only must the semiconductor device be replaced but the entire power supply must also be cleaned, repaired or replaced, significantly increasing the cost of such a failure. Experience has shown that, with prior art methods of assembling such heat-generating semiconductors, the failure rate has ranged from one to six percent per month, obviously an undesirable and expensive situation.

SUMMARY OF THE INVENTION

Accordingly, the present invention is directed to an assembly for mounting a heat-generating semiconductor to an associated heat sink whereby direct heat conducting contact is assured between the semiconductor body and the heat sink by an element which electrically isolates and insulates the semiconductor from the other components while at the same time locating and providing pressure to clamp the semiconductor on the heat sink. The present invention provides good thermal contact and adapts to thermal expansion of the system during operation to assure the maintainance of the contact regardless of temperature changes within the device.

According to one aspect of the present invention, an assembly for mounting a heat-generating semiconductor to an associated heat sink is provided for a semiconductor which includes a body portion of predetermined thickness. The assembly comprises a heat-dissipating base element having plan dimensions which are larger than the plan dimensions of the semiconductor. A retainer member is formed of a dielectric material and has means for locating and retaining the semiconductor. The retainer member also includes a plurality of arms connected to the locating and retaining means. The relative thicknesses of the semiconductor locating and retaining means and the semiconductor, and the positioning of the arms with respect thereto, are such that the ends of the arms are deflected when the retainer member is connected to the base element to force the semiconductor and the base element into intimate heat transmitting contact. Further means is provided for connecting the base element and the arms of the retainer member.

According to another aspect of the present invention, an assembly for mounting a heat-generating semiconductor to an associated heat sink and for interconnecting the semiconductor to an associated electrical component is provided for a semiconductor which includes a body portion of predetermined thickness, a plurality of leads protruding from the body portion and a metallic heat conductive mounting tab of predetermined thickness carried by the body portion and protruding in a direction opposite to the leads. The assembly comprises a generally planar heat-dissipating metal base plate having means for locating a dielectric sheet thereon. The plate has plan dimensions which are substantially larger than the plan dimensions of the semiconductor. A dielectric sheet is disposed between the semiconductor and the base plate. A retainer member is formed of a dielectric material and has a semiconductor cavity adapted to receive the semiconductor. The cavity has a body-receiving portion having a depth or thickness less than the thickness of the semiconductor body, and a tab-receiving portion having a depth or thickness greater than the thickness of the mounting tab. The retainer member includes two pair of arms disposed with each pair on opposite sides of the semiconductor cavity, and means for rigidly connecting the two pair of arms to the semiconductor cavity. The arms have a length greater than that of the semiconductor cavity. The retainer member also includes means for engaging and aligning the semiconductor leads. A hollow, generally rectangular housing member formed of a dielectric material is provided which has a cavity for receiving the semiconductor and the retainer member. The plan dimensions of the housing member are substantially equal to those of the base plate and the depth of the cavity is substantially greater than the combined thickness of the body portion of the semiconductor and the retainer member. The housing member is provided with integrally formed mounting pads disposed interiorly at each of the corners thereof which are arranged to each engage an end of one of the arms of the retainer member and to retain it between the mounting pad and the base plate when assembled. Means is provided for connecting the plate and the housing member to one another through the mounting pads in a substantially aligned relation with the arms of the retainer member being held therebetween so that the semiconductor and the dielectric sheet are held and maintained in contact with the base plate while the body portion of the semiconductor is substantially completely disposed within the semiconductor cavity. The relative thicknesses of the dielectric sheet, the semiconductor, and the semiconductor cavity, and the positioning of the arms with respect thereto is such that the mounting pads deflect the ends of the arms when the housing member is connected to the base plate to force the semiconductor, the dielectric sheet and the base plate into intimate heat transmitting contact. Connector means is also provided which includes a circuit board disposed within the housing member, which circuit board has a plurality of openings therethrough arranged to engage the semiconductor leads when they are aligned by the retainer member. The circuit board also has input and output terminal means adapted to be coupled with the associated electrical component.

Various means for practicing the invention and other features and advantages thereof will be apparent from the following detailed description of illustrative preferred embodiments of the invention, reference being made to the accompanying drawings.

DESCRIPTION OF THE PREFERRED EMBODIMENT

Figure 1:
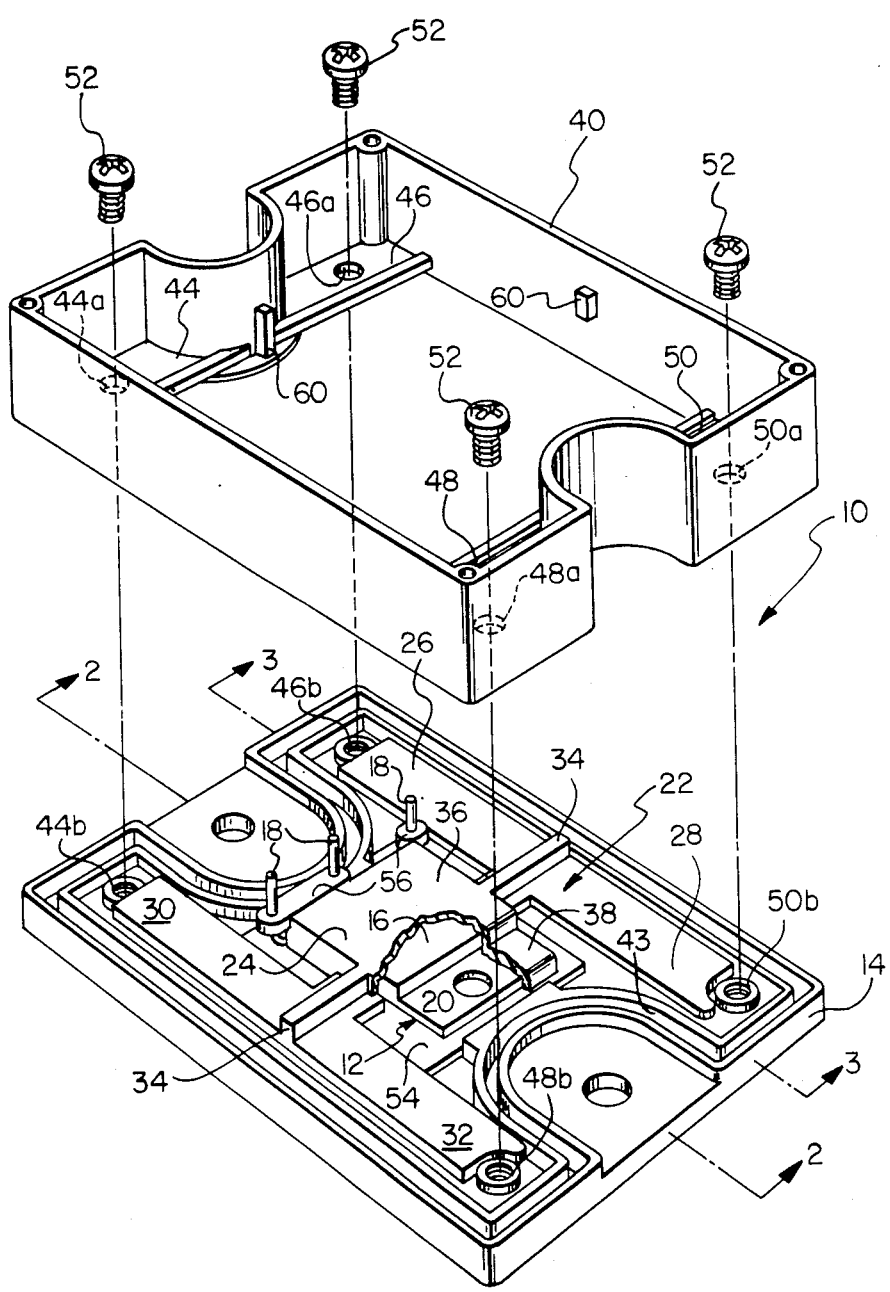
FIG. 1 is a partially exploded perspective view of the semiconductor mounting assembly.
Figure 2:
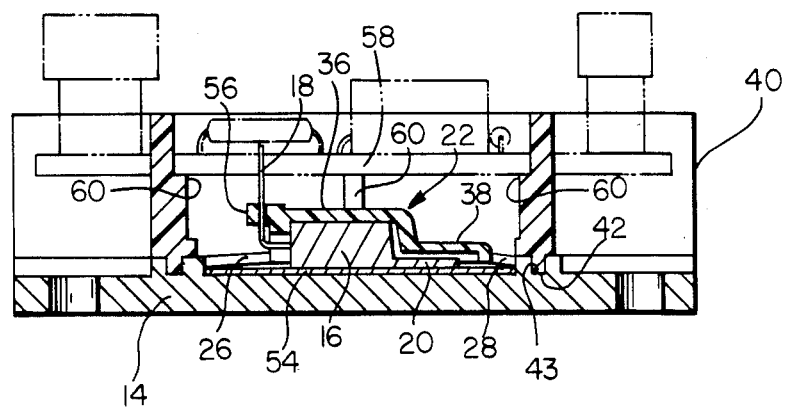
FIG. 2 is a sectional elevation of the semiconductor mounting assembly taken along line 2—2 of FIG. 1.
Figure 3:
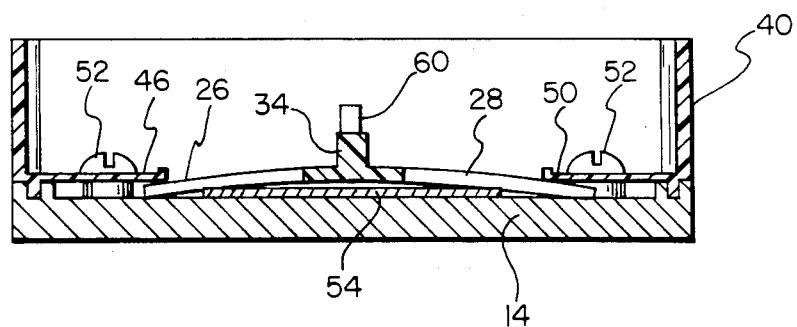
FIG. 3 is a sectional elevation of the semiconductor mounting assembly taken along line 3—3 of FIG. 1.

FIGS. 1-3 illustrate a preferred embodiment of a semiconductor mounting assembly 10 according to the present invention wherein a heat-generating semiconductor, such as a triac, 12 is mounted in intimate heat transmitting contact with a heat dissipating base element 14 which serves as a heat sink. While a triac is referred to throughout the present specification as representative of the heat-generating semiconductors useful with the present invention, it will be appreciated that the term is intended to refer generally to other forms of heat-generating semiconductors including, but not limited to SCR'S, thyristors, power transistors, power rectifiers, voltage regulators and the like. A typical triac semiconductor switching device 12 includes a main switch body portion 16 from which extend a plurality of electrical leads 18. A metallic heat conductive mounting tab 20 is carried by the body 16 and is co-extensive with one surface, the lower one in the illustration, and protrudes from the body in a direction opposite to the leads 18. The base element or plate 14, which acts as the heat sink, is preferably formed of a highly conductive material such as a metal plate which is not only thermally conductive, but also capable of dispersing the heat away from the heat source. Accordingly, the base element has plan dimensions substantially larger than the plan dimensions of the semiconductor 12 to facilitate this heat dispersal.

The semiconductor 12 is held in intimate heat conducting contact with the heat sink 14 by means of a retainer member 22 which is formed of a high temperature, high strength dielectric material. The retainer member 22 is provided with a semiconductor cavity portion 24 which is arranged to locate and retain the semiconductor therein. The retainer member also includes two pairs of arms 26, 28 and 30, 32 disposed with each pair on opposite sides of the semiconductor cavity 24. The arms are rigidly connected to the semiconductor cavity portion by beam members 34 extending therebetween. The semiconductor cavity portion 24 of the retainer member is provided with a semiconductor body-receiving portion 36 having a depth or thickness less than the thickness of the body of the semiconductor, and a semiconductor tab-receiving portion 26 which has a thickness or depth greater than the thickness of the mounting tab of the heat-generating semiconductor.

A hollow, generally rectangular housing member 40, also formed of a dielectric material, is provided with plan dimensions that are substantially co-extensive with those of the base element 14. The lower edge of the housing member is provided with a rib 42 which engages a cooperating channel 43 formed in the upper surface of base element 14 to locate the housing member with respect to the base element. The central portion of the housing member provides a cavity which receives and encloses the semiconductor 12 and the retainer member 22. The depth of the housing member is substantially greater than the overall depth of the semiconductor and the retainer member. The housing member is provided on the interior corners thereof with a plurality of integrally formed mounting pads 44, 46, 48 and 50, each of which is provided with a through hole 44a, 46a, 48a and 50a which are arranged in alignment with tapped holes 44b, 46b, 48b and 50b, provided in the base element 14, when the housing is mated therewith. Each of the mounting pads in the corners of the housing member is arranged to engage an end of a respective arm 26, 28, 30 or 32 when the housing is attached to the base element 14 as by means of screws 52 through holes 44a et seq into the tapped holes 44b et seq.

In the embodiment illustrated, the assembly is provided with a planar dielectric sheet 54, having planar dimensions generally larger than the semiconductor, which is disposed between the upper surface of the base element 14 and the lower surface of the triac 12 when the tab is electrically live and the base element is electrically conductive. This dielectric sheet assures the electrical insulation of the base of the triac from the base element 14, while assuring good thermal conductivity therebetween. The base element 14 may be provided with means for locating the dielectric sheet thereon. In accordance with accepted practices in the field of mounting such heat-generating semiconductors, an electrically insulative, thermally conductive "thermal compound" is spread in a thin layer between the triac and the dielectric sheet, and between the dielectric sheet and the base element to assure good thermal contact, and to eliminate any possible insulating air voids therebetween.

As illustrated in FIG. 2, the relative thickness of the dielectric sheet 54 and the semiconductor 12, as well as the depth of the semiconductor body-receiving portion 36 of the retainer member 22, and the positioning of the arms 26-32 with respect thereto, is such that when the retainer member is secured in position by the attachment of the housing member 40 to the base element 14, the mounting pads 44-50 deflect the ends of the arms thereby generating a downward force which is transmitted by beam members 34 to the semiconductor cavity 24, which, in turn, applies all of the pressure directly to the body 16 of semiconductor, pressing it and the dielectric sheet into intimate heat transfer contact with the base element.

As illustrated in FIGS. 1 and 2 the end of the semiconductor body cavity 36 of the retainer member 22 is provided with alignment and guide means 56 which are arranged to engage and properly orient and retain the semiconductor leads 18. In the embodiment illustrated, the leads are held in an upright position in a predetermined spacing whereby they are easily aligned with and inserted into a circuit board 58 (shown in phantom in FIG. 2) which is disposed in the upper part of the housing 40 and supported therein by ribs 60. Such a circuit board 58 includes the various electronic components and connector means necessary to connect the triac switching device to an associated electrical component. One example of the switching circuit provided by the circuit board 58 is illustrated in U.S. Pat. No. 3,648,075 which discloses a zero voltage switching AC relay circuit employing a triac heat-generating semiconductor device. When the circuit board is placed in the housing 40, because of the guide means 56 on the retainer member, the semiconductor leads 18 are held in proper position and alignment with lead holes formed through the circuit board. As one of the final steps in the assembly of the semiconductor mounting assembly, a soldering step connects the semiconductor leads to the appropriate portion of the circuit on board 58.

In the preferred embodiment, the housing member 40 and retainer member 22 are both formed of a high temperature plastic such as polyetherimide which has a temperature of deformation sufficiently above the maximum temperature allowable in such a semiconductor device that its structural integrity, electrical resistance, and stiffness, are retained at normal operating temperatures so that the spring force provided by the deflection of arms 26-32 is assured even at elevated temperatures. In the preferred embodiment illustrated, the retainer member arms provide a downward force at room temperature of about 15 pounds, forcing the semiconductor body into intimate heat contact with the heat sink so that, at elevated operating temperatures, there is still a force of at least 10 pounds holding the semiconductor body in contact with the heat sink. This assures that the thermal resistance of the hot assembly is controlled to the extent that reliability and lifetime of the operation of the heat producing semiconductor is significantly enhanced. As a result of the construction of the preferred embodiment it has been found that the life of the device has been extended from approximately 200,000 cycles to over 600 million cycles with only a single failure. In other terms, the life of the heat-generating semiconductor device has been extended to over 200,000 hours without a heat generated failure.

With the present construction, the retainer member electrically insulates and isolates the heat-generating semiconductor, or triac, from other conductive components. The retainer member creates a long circuituous path between the semiconductor and any other conductive components of the assembly thereby minimizing the chances of arc-over, enhancing the integrity of the assembly.

With the semiconductor mounting assembly of the present invention the retainer member provides a spring force to hold the semiconductor into intimate heat transfer contact with a heat sink in such a way that it adapts to thermal changes in the assembly. It has been found that with present construction the thermal resistivity between the heat-generating semiconductor and the heat sink actually decreases by as much as 10 percent with thermal cycling of the assembly.

The present semiconductor mounting assembly also provides the advantage that the parts are constructed and arranged so that the various components are easily located and oriented. Moreover, with the present construction it is not possible to successfully assemble the assembly while omitting a necessary component. If such a component is omitted, it will become immediately apparent and the assembly will not function, thus providing a fail safe assembly procedure. Still further, should a portion of the retainer member break, the fractured portion thereof will not create an undue risk of short circuiting as would be the case were the retainer member formed of an electrically conductive material.

Thus, the present invention provides an assembly for mounting a heat-generating semiconductor with features and advantages not heretofore found in such assemblies. Most importantly, the present assembly provides heat removal rates not heretofore possible resulting in extenson of life of the assembly of several magnitudes over that previously thought possible.

The invention has been described with reference to specific embodiments and variations, but it should be apparent that other modifications and variations can be made within the spirit and scope of the invention, which is defined by the following claims.

What is claimed is:

1. An assembly for mounting a heat-generating semiconductor to an associated heat sink wherein the semiconductor includes a body portion of predetermined thickness, said assembly comprising:
   a heat-dissipating base element having plan dimensions which are larger than the plan dimensions of said semiconductor,
   a retainer member formed of a dielectric material and having means for locating and retaining said semiconductor, said retainer member including a plurality of arms connected to said locating and retaining means,
   the relative thicknesses of said semiconductor locating and retaining means and said semiconductor and the positioning of said arms with respect thereto being such that the ends of said arms are deflected when said retainer member is connected to said base element to force said semiconductor and said base element into intimate heat transmitting contact, and
   means for connecting said base element and said arms of said retainer member.

2. An assembly for mounting a heat-generating semiconductor to an associated heat sink and interconnecting said semiconductor to an associated electrical component wherein the semiconductor includes a body portion of predetermined thickness and a plurality of leads protruding from the body portion, said assembly comprising:
   a heat-dissipating base element having plan dimensions which are larger than the plan dimensions of said semiconductor,
   means for electrically insulating said semiconductor,
   a retainer member formed of a dielectric material and having means for locating and retaining said semiconductor, said retainer member including a plurality of arms disposed on opposite sides of said semiconductor locating and retaining means, and means for rigidly connecting said arms to said semiconductor locating and retaining means,
   the relative thicknesses of said semiconductor locating and retaining means and said semiconductor and the positioning of said arms with respect thereto being such that the ends of said arms are deflected when said retainer member is connected to said base element to generate a spring force to force said semiconductor and said base element into intimate heat transmitting contact,
   means for connecting said base element and said arms of said retainer member to one another, and
   connector means coupled with the leads of said semiconductor for connecting said semiconductor to said associated electrical component.

3. The invention according to claim 2 wherein said retainer member is provided with means for engaging and aligning said semiconductor leads.

4. The invention according to claim 2 wherein said means for locating and retaining said semiconductor substantially encloses said semiconductor.

5. The invention according to claim 2 wherein said base element is provided with means for locating a dielectric sheet thereon.

6. The invention according to claim 4 wherein said semiconductor locating and retaining means includes a cavity portion which is provided with a semiconductor body-engaging roof portion.

7. The invention according to claim 2 wherein a housing member is provided which has plan dimensions substantially equal to those of said base element and a depth substantially greater than the combined thickness of the body portion of said semiconductor and said retainer member.

8. The invention according to claim 7 wherein said connector means includes a circuit board disposed within said housing member coupled with the leads of said semiconductor and having a plurality of electrical contacts.

9. The invention according to claim 3 wherein a housing member is provided which has plan dimensions substantially equal to those of said base element and a depth substantially greater than the combined thickness of the body portion of said semiconductor and said retainer member.

10. The invention according to claim 9 wherein connector means includes a circuit board disposed in said housing member which is provided with a plurality of openings, one for each lead of said semiconductor, arranged to engage said semiconductor leads when they are aligned by said retainer member.

11. The invention according to claim 2 including means disposed between said semiconductor and said base element which provides intimate heat conducting contact therebetween.

12. The invention according to claim 11 wherein said heat conducting means is a thermal compound paste.

13. An assembly for mounting a heat-generating semiconductor to an associated heat sink and interconnecting said semiconductor to an associated electrical component wherein the semiconductor includes a body portion of predetermined thickness, a plurality of leads protruding from the body portion and a metallic heat conductive mounting tab of predetermined thickness carried by the body portion and protruding in a direction opposite to the leads, said assembly comprising:
   a generally planar heat-dissipating base plate, said plate having plan dimensions which are larger than the plan dimensions of said semiconductor,
   a dielectric sheet,
   a retainer member formed of a dielectric material and having a semiconductor cavity adapted to locate and retain said semiconductor, said semiconductor cavity having a thickness less than the thickness of the semiconductor, said retainer member including a plurality of arms disposed on opposite sides of said semiconductor cavity, and means for rigidly connecting said arms to said semiconductor cavity,
   a housing member formed of a dielectric material having a cavity for receiving said semiconductor and said retainer member, said housing member being substantially similar in shape to said base plate and having integrally formed mounting pads disposed interiorly at each of the corners thereof, said mounting pads being arranged to each engage an end of one of said arms of said retainer member and to retain it between said mounting pad and said base plate when assembled, means for connecting said base plate and said housing member to one another through said mounting pads in a substantially aligned relation with said arms of said retainer member being held therebetween so that said semiconductor and said dielectric sheet are held and maintained in contact with said base plate, the relative thicknesses of said dielectric sheet, said semiconductor, and said semiconductor cavity, and the positioning of said arms with respect thereto being such that said mounting pads deflect the ends of said arms when said housing member is connected to said base plate to generate a spring force to force the body portion of said semiconductor, said dielectric sheet and said base plate into intimate heat transmitting contact, and connector means adapted to be coupled with the leads of said semiconductor for connecting said semiconductor to said associated electrical component.

14. The invention according to claim 13 wherein said retainer member is provided with means for engaging and aligning said semiconductor leads.

15. The invention according to claim 13 wherein said semiconductor cavity portion of said retainer member substantially encloses said semiconductor.

16. The invention according to claim 13 wherein said base plate is provided with means for locating said dielectric sheet thereon.

17. The invention according to claim 15 wherein said semiconductor cavity portion is provided with a semiconductor body engaging roof portion.

18. The invention according to claim 13 wherein said housing member has a depth substantially greater than the combined thickness of the body portion of said semiconductor and said retainer member.

19. The invention according to claim 18 wherein said connector means includes a circuit board disposed within said housing member coupled with the leads of said semiconductor and having a plurality of electrical contacts.

20. The invention according to claim 14 wherein said connector means includes a circuit board disposed within said housing member coupled with the leads of said semiconductor and having a plurality of electrical contacts.

21. The invention according to claim 20 wherein said circuit board is provided with a plurality of openings, one for each lead of said semiconductor, arranged to engage said semiconductor leads when they are aligned by said retainer member.

22. An assembly for mounting a heat-generating semiconductor to an associated heat sink and interconnecting said semiconductor to an associated electrical component wherein the semiconductor includes a body portion of predetermined thickness, a plurality of leads protruding from the body portion and a metallic heat conductive mounting tab of predetermined thickness carried by the body portion and protruding in a direction opposite to the leads, said assembly comprising:

a generally planar heat-dissipating metal base plate having means for locating a dielectric sheet thereon, said plate having plan dimensions which are substantially larger than the plan dimensions of said semiconductor, a dielectric sheet, a retainer member formed of a dielectric material and having a semiconductor cavity adapted to receive said semiconductor, said semiconductor cavity having a body-receiving portion having a thickness less than the thickness of the semiconductor body and a tab-receiving portion having a thickness greater than the thickness of said mounting tab, said retainer member including two pair of arms disposed with each pair on opposite sides of said semiconductor cavity, and means for rigidly connecting said two pair of arms to said semiconductor cavity, said arms having a length greater than that of said semiconductor cavity, said retainer member also including means for engaging and aligning said semiconductor leads, a hollow generally rectangular housing member formed of a dielectric material, said housing member having a cavity for receiving said semiconductor and said retainer member, the plan dimensions of said housing member being substantially equal to those of said base plate, the depth of said cavity being substantially greater than the combined thickness of the body portion of the semiconductor and said retainer member, said housing member having integrally formed mounting pads disposed interiorly at each of the corners thereof, said mounting pads arranged to each engage an end of one of said arms of said retainer member and to retain it between said mounting pad and said base plate when assembled, means for connecting said plate and said housing member to one another through said mounting pads in a substantially aligned relation with said arms of said retainer member being held therebetween so that said semiconductor and said dielectric sheet are held and maintained in contact with said base plate while the body portion is substantially completely disposed within said semiconductor cavity, the relative thicknesses of said dielectric sheet, said semiconductor, and said semiconductor cavity, and the positioning of said arms with respect thereto being such that said mounting pads deflect the ends of said arms when said housing member is connected to said base plate to generate a spring force to force said semiconductor, said dielectric sheet and said base plate into intimate heat transmitting contact, and connector means including a circuit board disposed within said housing member, said circuit board having a plurality of openings therethrough arranged to engage said semiconductor leads when they are aligned by said retainer member, said circuit board having terminal means adapted to be coupled with said associated electrical component.

* * * * *